United States Patent [19]

Heinen et al.

[11] Patent Number: 4,742,525
[45] Date of Patent: May 3, 1988

[54] COUPLED LASER DIODE ARRANGEMENT

[75] Inventors: Jochen Heinen, Haar; Markus-Christian Amann, Munich, both of Fed. Rep. of Germany

[73] Assignee: Siemens Aktiengesellschaft, Berlin and Munich, Fed. Rep. of Germany

[21] Appl. No.: 773,018

[22] Filed: Sep. 6, 1985

[30] Foreign Application Priority Data

Sep. 21, 1984 [DE] Fed. Rep. of Germany ....... 3434741

[51] Int. Cl.$^4$ .............................................. H01S 3/18
[52] U.S. Cl. ......................................... 372/44; 372/50
[58] Field of Search ....................... 372/43, 44, 46, 50

[56] References Cited

U.S. PATENT DOCUMENTS 4,101,845  7/1978  Russer .................................. 372/50

Primary Examiner—Gene Wan
Attorney, Agent, or Firm—Hill, Van Santen, Steadman & Simpson

[57] ABSTRACT

An arrangement of two coupled laser diodes comprises first and second two-layer structures, each structure having a strip-shaped laser-active zone, and a middle layer. The first and second two-layer structures are symmetrically constructed relative to the middle layer at opposite sides thereof and directly across from each other so that the strip-shaped laser-active zones in each of the two-layer structures are positioned at a defined spacing directly across from each other and in symmetrical manner with respect to the middle layer. The middle layer is epitaxially deposited with a precisely dimensioned thickness relative to the two coupled laser diodes being employed.

5 Claims, 1 Drawing Sheet

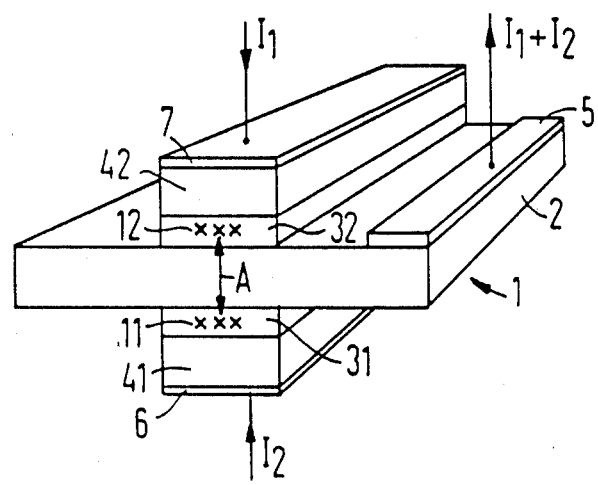

COUPLED LASER DIODE ARRANGEMENT

BACKGROUND OF THE INVENTION

The present invention relates to a coupled laser diode arrangement of two laser diodes in a layered format.

It is known to provide a plurality of p-n laser diodes in a common semiconductor body with their respective, laser-active zones in proximity such that a (respective) spacing of strip-shaped laser-active zones from one another is so small that wave-mechanical coupling of the laser radiation occurs in the individual strip-shaped zones.

Such a wave-mechanical coupling is exploited, for example, for generating monomode laser radiation. A control is also achieved of the laser beam generation in one zone by intensity variation and/or modification of the excitation conditions of the laser radiation in the other, proximate zone. For example, Jap. Journ. Appl. Phys., Vol. 17 (1978), pages 751–752 and Journ. Quantum Electr., Vol. QE 13 (1977), pages 619–622, both incorporated herein by reference, disclose arrangements which comprise a respective first and second zone lying on top of one another. Although laser radiation proceeds in both zones, radiation generation due to current flux through a p-n junction of the layer structures only occurs in the first zone. The other, second zone is a passive optical resonator which is wave-mechanically coupled to the first zone containing the p-n junction. The effective band space in the material of this second zone, i.e. in the zone of the passive resonator, is greater than that in the first zone having the p-n junction. If laser radiation were to be generated in this second zone, its frequency would be different from, namely higher, than the frequency of that laser radiation which is in fact generated in this known arrangement, namely in the first zone thereof comprising the p-n junction. The intended wave-mechanical coupling, though, would be impossible, i.e. the passive property of this second zone is of decisive significance for this prior art.

Array arrangements having mutually coupled strips which generate laser radiation, i.e. having mutually coupled laser diodes, are also known, and are provided in or on a semiconductor body. With respect to further details relating to such known arrangements, see "Appl. Physics Letters", Vol. 42 (1983), pages 152–154 and Vol. 43 (1983), pages 521–523; "Fourth Intern. Conference on Integrated Optics and Optical Fibre Communication", June 27–30, 1983, Tokyo; IEEE Journ. of Quantum Electronics", Vol. QE 18 (1982), pages 1679–1688; "Appl. Physics Letters", Vol. 41 (1982), pages 112–114; U.S. Pat. No. 4,347,612; U.S. Pat. No. 4,101,845; and U.S. Pat. No. 4,277,762. Further technological background to the present invention is specified in "IEEE Spectrum" (1983), pages 38–45. All of the above references are incorporated herein by reference.

The longitudinal series placement and the lateral juxtaposition of respective laser-active zones or laser diode strips in an arrangement on or in a substrate body is known from the above publications. The essential problem for the manufacture of such an arrangement is the adjustment of these zones or lasers relative to one another, since even slight spacing deviations have considerable influence. Also, an added problem in index-guided laser diodes is that the spacing dimensions coming into consideration are extremely small due to the low width of the wave-mechanical or wave-optical near field of the laser radiation. The laser diodes are usually laser diodes of the double-hetero structure type of, for example, indium-gallium-arsenide-phosphide/indium phosphide. Particularly given laser diodes of this type, two laser diodes to be coupled to one another can be disposed at a slight distance from one another, even given execution as index-guided laser diodes.

SUMMARY OF THE INVENTION

An object of the present invention is to specify an arrangement and a manufacturing method for this arrangement wherein reduced technological expense and/or enhanced reliability for the observation of prescribed spacings is achieved.

This object is achieved by providing first and second two layer structures on opposite sides of a middle layer so that laser-active zones of the respective two layer structures are positioned across from each other through the middle layer. The middle layer is an epitaxially deposited layer which is precisely dimensioned in terms of its thickness.

A principle of the invention is to provide two or more strip-shaped laser-active zones neighboring one another in stacked position on the semiconductor body. The semiconductor bodies of the laser diodes, and in particular those having double-hetero structure, are produced on top of one another by repeated epitaxial deposition of various layers. For a doublehetero structure, three layers and a substrate member are usually required, whereby the substrate member can also assume the function of one of the layers. The laser-active zone is at least largely situated in the region of the respective middle layer (given a 3-layer arrangement), whereby the precise position depends on known fine technological details such as doping degree and, under given conditions, gradient and/or selection of the materials of the layer sequence, and the like.

BRIEF DESCRIPTION OF THE DRAWINGS

The drawing FIGURE illustrates in perspective view an arrangement of the stacked and coupled laser diodes according to the invention.

DESCRIPTION OF THE PREFERRED EMBODIMENTS

The overall arrangement comprising two coupled laser diodes, which in this example is formed of two coupled, strip-shaped, laser-active zones, is referenced 1. In the illustration of the drawing FIGURE, one each of the laser diodes to be coupled to one another is situated above and below a middle layer 2 of, for example In P, and serving as the substrate body. The substrate body is the middle layer 2 and also the first layer of the respective double-hetero structure of the individual diodes to which the layers 31 and 32 as well as 41 and 42 respectively are associated. Two symmetry parts are thus present. As shown, these layers 31, 32, 41, 42 are epitaxially deposited and stacked on one another or on the middle layer 2. In the normal case, the form shown in the drawing FIGURE will be produced by a following etching process since, although such shaping is possible in the course of epitaxial deposition, it is involved. The layers 31, 32 are composed, for example, of In GaAs P, and the layers 41 and 42 are composed, for example, of In P.

The electrical substrate terminal is referenced 5, this, for example, being a strip-shaped contact electrode.

Further strip-shaped or surface-shaped electrodes are referenced 6 and 7. The electrical current $I_1$, $I_2$ serving for the laser excitation flows, for example, as shown in the drawing FIGURE. The end-face, cross-sectional surfaces of the respective strip-shaped laser-active zones are referenced 11 and 12. Their spacing from one another is indicated with the arrow A.

As may be seen, the substrate 2 is a significant part of the semiconductor material situated between the zones 11 and 12 across which the wave-optical coupling occurs. The thickness of this middle layer 2, for which dimensions of about 0.1 through 0.3 $\mu$m are to be observed, essentially defines the spacing A. In the epitaxial manufacturing method, however, the thickness of a layer can be very precisely set or adhered to. Even for mass production, the invention offers the assurance of low unit scatter and a low reject rate. The advantage is also produced with the invention that (later) external influences acting on the arrangement 1 cannot influence the spacing-dependent, wave-optical coupling of the zones 11 and 12. The coupling region is hermetically closed off from the outside.

An arrangement 1 of the invention is manufactured in that the layers sequenced as seen in the drawing FIGURE are successively epitaxially deposited on top of one another and the semiconductor parts initially arising at the side of the layers 41, 31, 32 and 42 during the deposition are subsequently etched off in an advantageous way. This is carried out with a usually employed mask etching, ion etching, and the like, as is well known to those skilled in this art.

Although various minor changes and modifications might be proposed by those skilled in the art, it will be understood that we wish to include within the claims of the patent warranted hereon all such changes and modifications as reasonably come within our contribution to the art.

We claim as our invention:

1. An arrangement of two coupled laser diodes, comprising:
    first and second two-layer structures, each structure having a strip-shaped laser-active zone;
    a middle layer;
    a first of the two diodes being formed of the first two-layer structure together with the middle layer and a second of the two diodes being formed of the second two-layer structure together with the middle layer;
    the first and second two-layer structures being symmetrically constructed relative to the middle layer at opposite sides thereof so that the strip-shaped laser-active zones in each of the two-layer structures are positioned adjacent the middle layer and at a defined spacing directly opposite from each other and in symmetrical manner with respect to the middle layer; and
    the middle layer being an epitaxially deposited layer having a precisely dimensioned thickness relative to the two coupled laser diodes being formed.

2. An arrangement according to claim 1 wherein the individual laser diodes are index-guided lasers.

3. An arrangement according to claim 1 wherein a thickness of the middle layer is dimensioned between 0.1 and 0.3 $\mu$m.

4. A method for manufacturing an arrangement of two coupled laser diodes, comprising the steps of:
    providing a first two-layer structure having a strip-shaped laser-active zone;
    epitaxially depositing on the first two-layer structure a middle layer;
    epitaxially depositing on the middle layer a second two-layer structure having a strip-shaped laser-active zone so that a first of the two diodes is formed of the first two-layer structure together with the middle layer and a second of the two diodes is formed of the second two-layer structure together with the middle layer, and wherein the first and second two-layer structures are symmetrically constructed relative to the middle layer at opposite sides thereof and directly opposite from each other so that the strip-shaped laser-active zones in each of the two-layer structures are positioned adjacent the middle layer at a defined spacing directly opposite from each other and in a symmetrical manner with respect to the middle layer; and
    providing the middle layer with a precisely dimensioned thickness relative to the two couples laser diodes being employed.

5. A method according to claim 4 wherein the first and second two-layer structures are etched.

* * * * *